United States Patent [19]
Liu et al.

[11] Patent Number: 5,652,155
[45] Date of Patent: Jul. 29, 1997

[54] METHOD FOR MAKING SEMICONDUCTOR CIRCUIT INCLUDING NON-ESD TRANSISTORS WITH REDUCED DEGRADATION DUE TO AN IMPURITY IMPLANT

[75] Inventors: David K. Y. Liu, Cupertino; Ming Sang Kwan, San Leandro; Chi Chang, Redwood City, all of Calif.

[73] Assignee: Advanced Micro Devices, Inc., Sunnyvale, Calif.

[21] Appl. No.: 550,424

[22] Filed: Oct. 30, 1995

[51] Int. Cl.⁶ .................................................. H01L 21/266
[52] U.S. Cl. .............................. 437/35; 437/56; 437/157
[58] Field of Search .............................. 437/27, 28, 29, 437/35, 36, 56, 154, 156, 157

[56] References Cited

U.S. PATENT DOCUMENTS

| | | | |
|---|---|---|---|
| 5,040,035 | 8/1991 | Gabara et al. | 437/36 |
| 5,406,111 | 4/1995 | Sun | 437/28 |
| 5,496,751 | 3/1996 | Wei et al. | 437/35 |

*Primary Examiner*—Chandra Chaudhari
*Attorney, Agent, or Firm*—Benman Collins & Sawyer

[57] ABSTRACT

A method for reducing encroachment of an impurity implant into a channel region in a non-ESD transistor in a semiconductor circuit, the non-ESD transistor receiving both first and second implant dopants, and the circuit including a plurality of ESD transistors includes forming the ESD transistors of the circuit at a predetermined angular offset from the non-ESD transistor, and performing the second dopant implant at a predetermined tilt implant angle, wherein the non-ESD transistor has reduced encroachment of the impurity implant. A plurality of transistors formed on a semiconductor wafer include a plurality of non-ESD transistors, the plurality of non-ESD transistors including spacer regions and impurity implant regions encroaching the spacer regions, and a plurality of ESD transistors, the plurality of ESD transistors formed at a predetermined angular offset from the non-ESD transistors. Further, the plurality of ESD transistors include the spacer regions and impurity implant regions encroaching the spacer regions further than the impurity implant regions of the non-ESD transistors.

15 Claims, 3 Drawing Sheets

5,652,155

METHOD FOR MAKING SEMICONDUCTOR CIRCUIT INCLUDING NON-ESD TRANSISTORS WITH REDUCED DEGRADATION DUE TO AN IMPURITY IMPLANT

FIELD OF THE INVENTION

The present invention relates generally to fabrication of semiconductor circuits including electrostatic discharge (ESD) transistors and more particularly to the fabrication of non-ESD transistors with reduced degradation from an impurity implant.

BACKGROUND OF THE INVENTION

Semiconductor circuit fabrication continually seeks to reduce device configurations to increase device density and overall system speed. In reducing the size of these devices, the individual, physical layers that form these devices have also been reduced. For example, the gate oxide layer has become increasingly thinner with the reduction of typical transistor devices. The thinning of the gate oxide layer presents greater sensitivity of the devices to electrostatic discharge (ESD) which results in increased device breakdown.

Protection transistors are often included in circuits to specifically handle ESD events. In CMOS (complementary metal oxide semiconductor) fabrication, introducing a particular dopant impurity into the source/drain region of a selected number of NMOS transistors has been found to often improve the robustness of the ESD characteristics of these transistors. One such example includes implanting a lighter dose of a phosphorous implant into the source/drain of output NMOS ESD protection transistors in the CMOS circuit.

Unfortunately, the impurity implant can alter the characteristics of non-ESD transistors in the circuit, including causing an increase in the short channel and hot electron effects. However, introducing another masking step in order to "hide" these transistors from the implant increases processing complexity and manufacturing costs.

What is needed therefore is the introduction of the impurity implant to selected ESD transistors while minimizing the impact on the remaining transistors without requiring an additional masking.

The present invention addresses these needs.

SUMMARY OF THE INVENTION

In one of embodiment of the present invention, a method for reducing encroachment of an impurity implant into a channel region in a non-ESD transistor in a semiconductor circuit, the non-ESD transistor receiving both first and second implant dopants, and the circuit including a plurality of ESD transistors includes forming the ESD transistors of the circuit at a predetermined angular offset from the non-ESD transistor, and performing the second dopant implant at a predetermined tilt implant angle, wherein the non-ESD transistor has reduced encroachment of the impurity implant.

In another embodiment of the present invention, a method for reducing encroachment of an impurity implant into the channel region in a plurality of non-ESD transistors in a semiconductor wafer circuit, the plurality of non-ESD transistors receiving first and second implant dopants, and the circuit including a plurality of ESD transistors, includes forming a plurality of non-ESD transistors, the non-ESD transistors including a gate region, LDD regions, spacer regions, and source and drain regions, in a predetermined orientation with respect to a flat of the wafer. The method further includes forming a plurality of ESD transistors with a predetermined angular offset from the plurality of non-ESD transistors, and performing a second dopant implant with a predetermined implant angle to reduce the encroachment of the impurity implant in the plurality of non-ESD transistors.

In a further aspect, the predetermined orientation includes a parallel or perpendicular orientation. Additionally, the predetermined angular offset includes a 45° offset. Further, the invention includes a predetermined implant angle of 45°.

In yet another embodiment of the present invention, a plurality of transistors formed on a semiconductor wafer include a plurality of non-ESD transistors, the plurality of non-ESD transistors including spacer regions and impurity implant regions encroaching the spacer regions, and a plurality of ESD transistors, the plurality of ESD transistors formed at a predetermined angular offset from the non-ESD transistors. Further, the plurality of ESD transistors include the spacer regions and impurity implant regions encroaching the spacer regions further than the impurity implant regions of the non-ESD transistors.

With the present invention, an effective increase in the width of the spacer is provided to reduce the amount of encroachment of a second impurity implant in the non-ESD transistors of a circuit. Further, the present invention achieves this reduction without requiring additional masking steps and thus is easily integratable into fabrication processing. In addition, since there are no extra masking steps used by the present invention, manufacturing complexity and cost, as well as the potential for contamination and damage of the circuit, are not increased. Further, the reduction in the amount of encroachment produced by the present invention helps reduce the potential for adverse short channel and hot electron effects in the non-ESD transistors, while maintaining improved robustness in the ESD transistors with the second impurity implant.

These and other advantages of the aspects of the present invention will be more fully understood in conjunction with the following detailed description and accompanying drawings.

DETAILED DESCRIPTION OF THE INVENTION

The present invention is directed toward effective and efficient semiconductor circuit fabrication that includes a second impurity implant for improved robustness of ESD transistors, while not detrimenting the characteristics of non-ESD transistors in the circuit. The following description is presented to enable one of ordinary skill in the art to make and use the invention and is provided in the context of a patent application and its requirements. Various modifications to the preferred embodiment will be readily apparent to those skilled in the art and the generic principles and features described herein.

Figure 1:
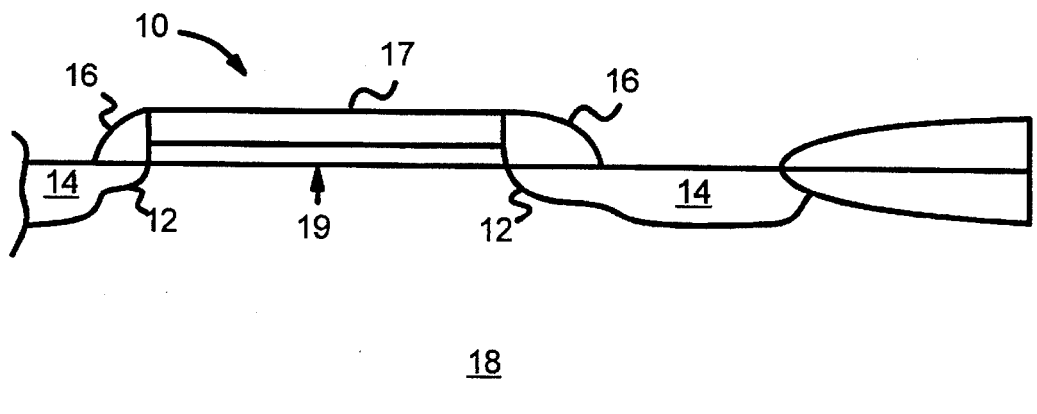
FIG. 1 illustrates a partial cross-sectional view of a standard NMOS transistor.

In FIG. 1, a partial cross-sectional view of a standard NMOS transistor 10 used commonly in CMOS circuits is shown. Transistor 10 includes n-type lightly doped drain (N-LDD) regions 12 offset from source/drain regions 14. By way of example, using conventional techniques, N-LDD regions 12 are suitably formed by a Phosphorous (Phos) implant with a dose of from $10^{13}/cm^2 - 10^{14}/cm^2$ and source/drain regions 14 are suitably formed by an (As m.H. c.c.) implant at a dose of about $5 \times 10^{15}/cm^2$. Spacers 16 are further included adjacent gate 17, and gate 17 and spacers 16 are also suitably formed using conventional techniques. Typically, the transistor 10 is designed to an optimal tradeoff such that the N-LDD LDD regions 12 offers a buffer region between the substrate 18, a channel region 19 and the source/drain regions 14 to protect against hot electron effects during device operation. Further, typically, the channel region 15 of the transistor 10 is reduced to as small a size as possible while still maintaining a high enough margin against short channel effects.

Figure 2:
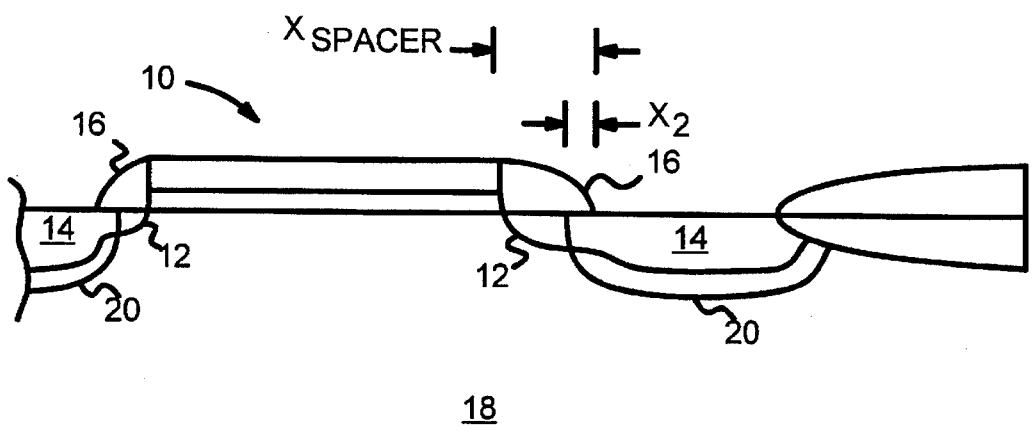
FIG. 2 illustrates the partial cross-sectional view of FIG. 1 following an impurity implant.

At times, transistor 10 has been found to have limited ability to provide adequate ESD protection in the circuit. FIG. 2 illustrates the partial crosssectional view of transistor 10 of FIG. 1 with an additional impurity implant 20 into source/drain regions 14, e.g., formed by a suitable implant of phosphorous (Phos) at a dose of about $10^{14}/cm^2$. The additional implant 20 has usually been found to provide a significant improvement in ESD robustness for transistor 10.

As is further shown in FIG. 2, the additional implant 20 encroaches the spacer 16 by an amount designated as $X_2$. With the encroachment of $X_2$, the short channel and hot electron effects in the non-ESD transistors is potentially made worse than in conventionally formed non-ESD transistors. In accordance with the present invention, the amount of encroachment $X_2$ is reduced in a convenient and straightforward manner to reduce the potential of short channel and hot electron effects. More particularly, the present invention does not require extra masking to isolate the non-ESD transistors from the second implant, and rather, utilizes transistor orientation and tilt implant angles to effectively reduce the encroachment problem in the non-ESD transistors.

Figure 3A:
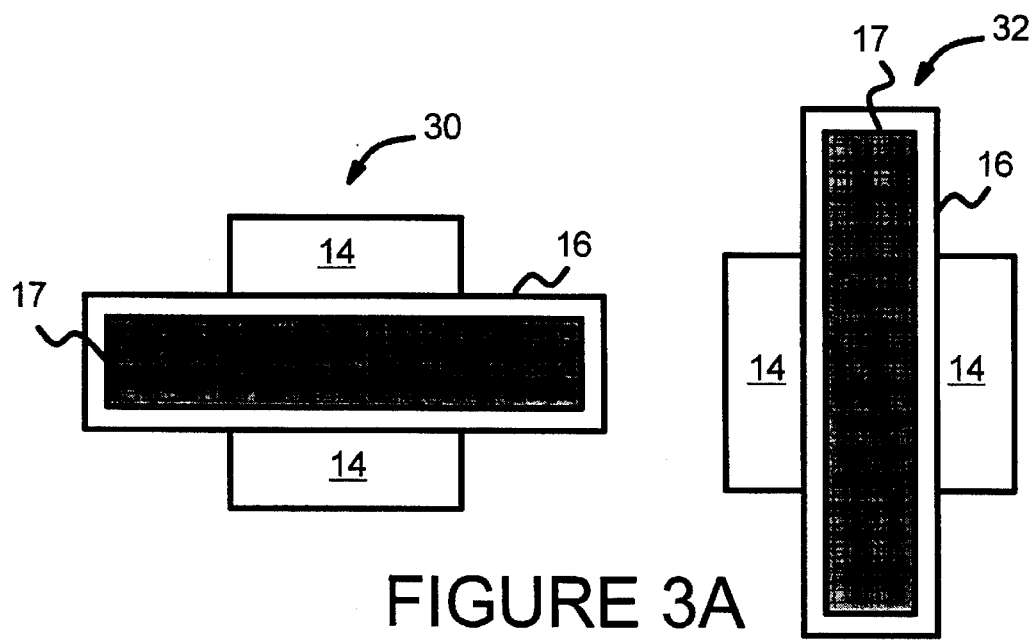
FIG. 3a illustrates a top-view of a conventional orientation of non-ESD transistors.

FIG. 3a illustrates a top-view of a conventional orientation of non-ESD transistors 30 and 32 on a semiconductor wafer. Although not identical, like features have been labelled similarly to that of transistor 10 in FIG. 1. As shown, typically, transistors 30 and 32 are aligned with gates 17 in either a horizontal or a vertical direction (i.e., parallel or perpendicular to a flat of the wafer) due to silicon crystal orientation and carrier mobility, as is well understood by those skilled in the art. The present invention takes to advantage the conventional vertical or horizontal layout of transistors 30 and 32 to minimize the detrimental effects of the second implant on non-ESD transistors.

Figure 3B:
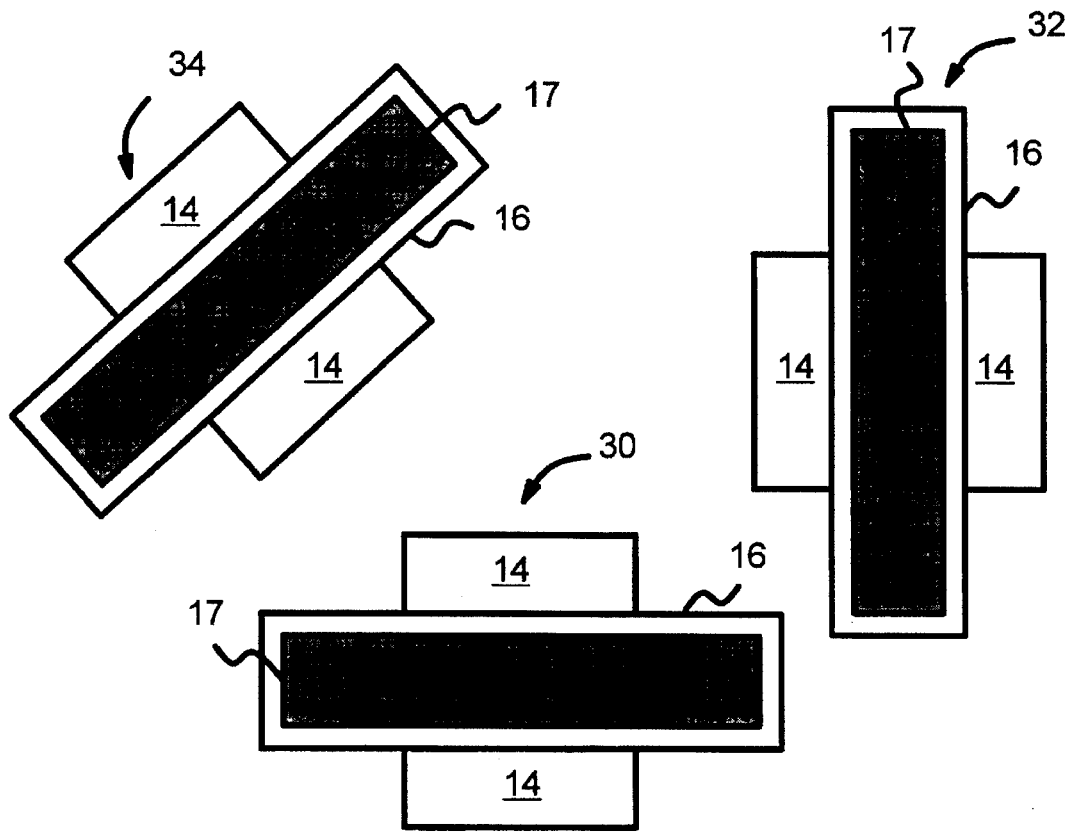
FIG. 3b illustrates a top-view of an orientation of non-ESD and ESD transistors in accordance with the present invention.

In accordance with the present invention, FIG. 3b illustrates the non-ESD transistors 30 and 32 of FIG. 3a together with an ESD protection transistor 34. As shown, transistor 34 is formed at a predetermined angular offset from transistors 30 and 32. In a preferred embodiment, the angular offset is 45° or 225° depending upon the relative layout of the transistors. Forming the transistor 34 at an angular offset includes merely providing appropriate masking patterns on the wafer during fabrication, as is well understood by those skilled in the art.

Figure 4:
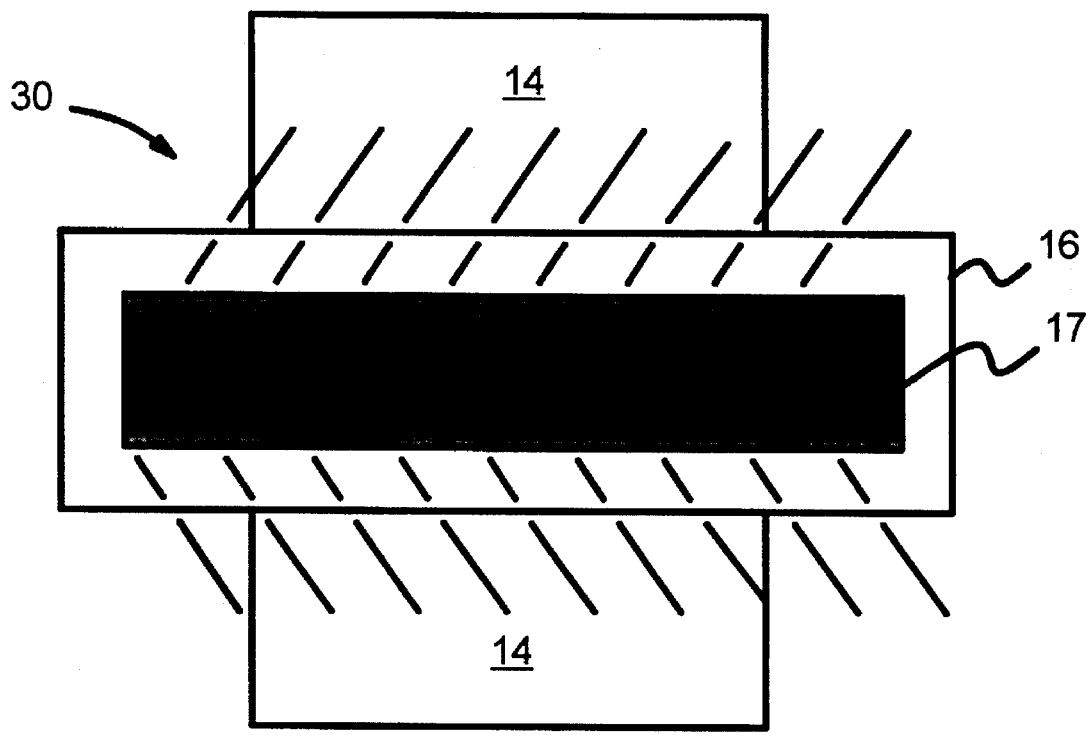
FIG. 4 illustrates a tilt angle impurity implant beam and a non-ESD transistor in accordance with the present invention.

With the formation of ESD protection transistor 34 oriented at an angular offset from non-ESD transistors 30 and 32, the present invention further includes providing the second impurity implant at a predetermined tilt angle. For example, with a tilt angle implant of 45° for the impurity implant and a 45° angular offset of transistor 34, the incident beam is either parallel or perpendicular to the transistor 34. In contrast, the non-ESD transistors 30 and 32 receive the incident beam at the tilt angle, e.g., 45°. By way of example, FIG. 4 illustrates the direction of the impurity implant that transistor 30 receives, which is suitably an implant at a predetermined tilt angle of 45°. With a 45° tilt angle implant, the spacer 16 of transistor 30 appears to the implant beam with a width of $\sqrt{2}$ times $X_{spacer}$ (FIG. 2).

The effective increase in the width of the spacer that the present invention provides capably decreases the amount of encroachment of a second impurity implant in the non-ESD transistors of a circuit. Further, the reduction in the encroachment beyond the spacer is effectively achieved without requiring additional masking steps. Additional masking steps currently increase both manufacturing complexity and cost, as well as the potential for contamination and damage of the circuit. The reduction in the amount of encroachment also reduces the potential for adverse short channel and hot electron effects in the non-ESD transistors. In addition, the ESD transistors maintain the improved ability to withstand high voltage ESD events achieved in large part through the second impurity implant.

Although the present invention has been described in accordance with the embodiments shown in the figures, one of ordinary skill in the art recognizes there could be variations to the embodiments and those variations would be within the spirit and scope of the present invention. For example, although the present invention has been described with reference to NMOS transistors, it is also suitably similarly applied to PMOS transistors with the appropriate changes to types of dopants. Accordingly, many modifications may be made by one of ordinary skills in the art without departing from the spirit and scope of present invention, the scope of which is defined solely by the appended claims.

What is claimed is:

1. A method for reducing encroachment of impurity implant into a channel region in a non-ESD transistor in a semiconductor circuit, the non-ESD transistor receiving both first and second implant dopants, and the circuit including a plurality of ESD transistors, the method comprising:
    forming the ESD transistors of the circuit at a predetermined angular offset from the non-ESD transistor; and
    performing the second dopant implant at a predetermined tilt implant angle, wherein the non-ESD transistor has reduced encroachment of the impurity implant.

2. The method of claim 1 wherein the predetermined angular offset is 45°.

3. The method of claim 2 wherein predetermined implant angle is 45°.

4. The method of claim 3 wherein the reduced encroachment area is about $\sqrt{2}$ times a width of the spacer.

5. The method of claim 1 wherein the non-ESD transistor comprises an NMOS transistor.

6. The method of claim 5 wherein the second dopant implant comprises an implant of phosphorous.

7. The method of claim 6 wherein the second implant dopant comprises a dopant level of about $10^{14}$ cm$^2$.

8. A method for reducing encroachment of impurity implant into a channel region in a plurality of non-ESD transistors in a semiconductor wafer circuit, the plurality of non-ESD transistors receiving first and second implant dopants, and the circuit including a plurality of ESD transistors, the method comprising:

forming a plurality of non-ESD transistors, the non-ESD transistors including a gate region, LDD regions, spacer regions, and source and drain regions, in a predetermined orientation with respect to a flat of the wafer;

forming a plurality of ESD transistors with a predetermined angular offset from the plurality of non-ESD transistors; and performing a second dopant implant with a predetermined implant angle to reduce the encroachment of the spacer regions in the plurality of non-ESD transistors.

9. The method of claim 8 wherein the predetermined orientation comprises a parallel orientation.

10. The method of claim 8 wherein the predetermined orientation comprises a perpendicular orientation.

11. The method of claim 8 wherein predetermined implant angle is 45°.

12. The method of claim 8 wherein the reduced encroachment area is about $\sqrt{2}$ times a width of the spacer.

13. The method of claim 8 wherein the non-ESD transistor comprises an NMOS transistor.

14. The method of claim 13 wherein the second dopant implant comprises an implant of phosphorous.

15. The method of claim 14 wherein the second implant dopant comprises a dopant level of about $10^{14}$ cm$^2$.

* * * * *